United States Patent
Zhou (10) Patent No.: US 12,014,932 B2
(45) Date of Patent: Jun. 18, 2024

(54) MEMORY, SUBSTRATE STRUCTURE OF THE MEMORY, AND METHOD FOR PREPARING THE SUBSTRATE STRUCTURE OF THE MEMORY

(71) Applicant: Changxin Memory Technologies, Inc., Anhui (CN)

(72) Inventor: Zhen Zhou, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 216 days.

(21) Appl. No.: 17/396,690

(22) Filed: Aug. 7, 2021

(65) Prior Publication Data
US 2021/0366725 A1 Nov. 25, 2021

Related U.S. Application Data

(63) Continuation of application No. PCT/CN2020/099985, filed on Jul. 2, 2020.

(30) Foreign Application Priority Data

Nov. 26, 2019 (CN) .......................... 201911175485.7

(51) Int. Cl.
*H01L 21/311* (2006.01)
*H01L 21/02* (2006.01)

(52) U.S. Cl.
CPC .. *H01L 21/31144* (2013.01); *H01L 21/02164* (2013.01); *H01L 21/0217* (2013.01); *H01L 21/31111* (2013.01)

(58) Field of Classification Search
CPC ......... H01L 21/31144; H01L 21/02164; H01L 21/0217; H01L 21/31111
See application file for complete search history.

(56) References Cited

U.S. PATENT DOCUMENTS 10,096,520 B2   10/2018   Baek et al.
10,312,088 B1 *  6/2019   Chang ................. H01L 21/0335
(Continued)

FOREIGN PATENT DOCUMENTS

CN   105244321 A   1/2016
CN   105390399 A   3/2016
(Continued)

OTHER PUBLICATIONS

PCT International Search Report and the Written Opinion dated Sep. 23, 2020, issued in related International Application No. PCT/CN2020/099985 (9 pages).
(Continued)

*Primary Examiner* — Monica D Harrison
*Assistant Examiner* — Andre C Stevenson
(74) *Attorney, Agent, or Firm* — Sheppard Mullin Richter & Hampton LLP (57) ABSTRACT

A substrate structure of the memory, and a method for preparing the substrate structure of the memory are provided. The method includes: providing a substrate; forming a first mask layer on the substrate, the first mask layer including a plurality of strip patterns extending in a direction and spaced apart from each other; forming a first dielectric layer covering the first mask layer; forming a plurality of sacrificial portions spaced apart from each other in the first dielectric layer and covering a portion of the plurality of strip patterns; filling gaps between the sacrificial portions with a second dielectric material; forming a second mask layer by removing the sacrificial portions while retaining the second dielectric material in the gaps; and performing layer-by-layer etching into the substrate to form a plurality of active areas arranged in an array.

17 Claims, 5 Drawing Sheets

(56) References Cited

U.S. PATENT DOCUMENTS

| | | | | |
|---|---|---|---|---|
| 2012/0164821 | A1* | 6/2012 | Kim | .................... H01L 21/0273 |
| | | | | 438/588 |
| 2016/0071907 | A1 | 3/2016 | Inaba | |
| 2016/0196982 | A1 | 7/2016 | Kang et al. | |
| 2016/0203992 | A1 | 7/2016 | Yoon et al. | |
| 2017/0025420 | A1 | 1/2017 | Park et al. | |
| 2018/0254219 | A1 | 9/2018 | Sun et al. | |
| 2019/0027411 | A1 | 1/2019 | Sun et al. | |
| 2019/0088717 | A1* | 3/2019 | Yeh | ....................... H10B 63/845 |
| 2021/0098461 | A1* | 4/2021 | Shih | ...................... H01L 23/528 |

FOREIGN PATENT DOCUMENTS

| | | | |
|---|---|---|---|
| CN | 107706206 | A | 2/2018 |
| CN | 109148376 | A | 1/2019 |
| KR | 2011-0112723 | A | 10/2011 |

OTHER PUBLICATIONS

PCT International Search Report and the Written Opinion dated Sep. 23, 2020, issued in related International Application No. PCT/CN2020/099985, with English translation (12 pages).

PCT International Preliminary Report on Patentability dated Jun. 9, 2022, issued in related International Application No. PCT/CN2020/099985, with English translation (9 pages).

Extended European Search Report dated Aug. 25, 2022, issued in related European Patent Application No. 20891550.4 (8 pages).

First Search dated May 18, 2022, issued in related Chinese Application No. 2019111754857 (1 page).

\* cited by examiner

MEMORY, SUBSTRATE STRUCTURE OF THE MEMORY, AND METHOD FOR PREPARING THE SUBSTRATE STRUCTURE OF THE MEMORY

CROSS-REFERENCE TO RELATED APPLICATIONS

This application is a continuation application of International Patent Application No.: PCT/CN2020/099985, filed on Jul. 2, 2020, which claims priority to Chinese Patent Application No.: 201911175485.7, filed on Nov. 26, 2019. The above-referenced applications are incorporated herein by reference in their entirety.

TECHNICAL FIELD

The present invention relates to the field of integrated circuit technologies, and in particular, to a memory, a substrate structure of the memory, and a method for preparing the substrate structure of the memory.

BACKGROUND

With the rapid development of integrated circuit technologies, memory devices are attracting more attention.

A memory may include a substrate structure and a capacitor structure on the substrate structure. In the process of preparing the substrate structure of the memory, a plurality of strip patterns may first be formed on the substrate. Then, the strip patterns may be severed to form a mask layer, and the substrate may be etched using the mask layer as a mask to form active areas. However, the strip patterns are often difficult to be severed, making it difficult to form the active areas on the substrate.

The information disclosed in the background part is only used to enhance the understanding of the background of the present invention, and therefore may include information that does not constitute the prior art known to a person of ordinary skill in the art.

SUMMARY

One aspect of the present invention is directed to a method for preparing a substrate structure of a memory.

The method may include providing a substrate; forming a first mask layer on a surface of the substrate, the first mask layer comprising a plurality of strip patterns extending in a direction and spaced apart from each other; forming a first dielectric layer covering the first mask layer; patterning the first dielectric layer to form a plurality of sacrificial portions spaced apart from each other, the sacrificial portions covering a portion of the plurality of strip patterns; filling gaps between the sacrificial portions with a second dielectric material; forming, by removing the sacrificial portions while retaining the second dielectric material in the gaps, a second mask layer, with through-hole patterns exposing the strip patterns formed in areas that correspond to the sacrificial portions in the second mask layer; and performing layer-by-layer etching using the first mask layer and the second mask layer as masks to transfer the strip patterns and the through-hole patterns to the substrate to form a plurality of active areas arranged in an array.

In some embodiments, patterning the first dielectric layer to form the plurality of sacrificial portions spaced apart from each other may include: forming a plurality of first through-holes distributed in an array in the first dielectric layer; and forming a plurality of second through-holes distributed in an array in the first dielectric layer.

The first through-holes and the second through-holes may be alternately arranged in both a first direction and a second direction perpendicular to the first direction. An orthographic projection of any first through-hole on the substrate may be in contact or overlap with an orthographic projection of a neighboring second through-hole on the substrate in the first direction and the second direction. A portion of the first dielectric layer between any two neighboring first through-holes in a third direction may form the sacrificial portion, and a deviation angle of the third direction relative to the first direction may be $\pi/4$.

In some embodiments, the first through-holes and the second through-holes may have the same cross-sectional shape.

In some embodiments, the first through-holes and the second through-holes may be circular holes.

In some embodiments, the first through-holes and the second through-holes may have the same diameter.

In some embodiments, removing the sacrificial portions while retaining the second dielectric material in the gaps may include: etching the sacrificial portions to form the second mask layer, wherein the through-hole patterns exposing the strip patterns are formed in the areas that correspond to the sacrificial portions in the second mask layer.

In some embodiments, an etching rate of the second dielectric material may be less than an etching rate of the sacrificial portion. Etching the sacrificial portions to form the second mask layer may include: etching the sacrificial portions and the second dielectric material to form the second mask layer, wherein the through-hole patterns exposing the strip patterns are formed in the areas that correspond to the sacrificial portions in the second mask layer.

In some embodiments, the second dielectric material may be silicon oxide, and the sacrificial portion may be made of silicon nitride.

In some embodiments, etching the sacrificial portions and the second dielectric material to form the second mask layer may include: etching, by using phosphoric acid, the sacrificial portions and the second dielectric material to form the second mask layer, wherein the through-hole patterns exposing the strip patterns are formed in the areas that correspond to the sacrificial portions in the second mask layer.

In some embodiments, the second dielectric material may be silicon nitride, and the sacrificial portion may be made of silicon oxide.

In some embodiments, etching the sacrificial portions and the second dielectric material to form the second mask layer may include: etching, by using hydrofluoric acid, the sacrificial portions and the second dielectric material to form the second mask layer, wherein the through-hole patterns exposing the strip patterns are formed in the areas that correspond to the sacrificial portions in the second mask layer.

In some embodiments, performing layer-by-layer etching using the first mask layer and the second mask layer as masks to transfer the trip patterns and the through-hole patterns to the substrate to form a plurality of active areas arranged in an array may include: etching, using the second mask layer as a mask, the first mask layer, to transfer the through-hole patterns to the first mask layer to sever the strip patterns; and etching, using the first mask layer with severed strip patterns as a mask, the substrate, to transfer the strip patterns and the through-hole patterns to the substrate to form the plurality of active areas arranged in an array.

In some embodiments, a distance between any two adjacent sacrificial portions may be greater than the maximum size of any sacrificial portion in a direction parallel to the substrate.

In some embodiments, filling the gaps between the sacrificial portions with the second dielectric material may include: forming a second dielectric layer covering the sacrificial portions and the gaps between the sacrificial portions; and removing portions of the second dielectric layer outside the gaps.

In some embodiments, removing the portions of the second dielectric layer outside the gaps may include: removing, by using a chemical mechanical grinding process, the portions of the second dielectric layer outside the gaps.

Another aspect of the present invention is directed to a substrate structure of a memory. The substrate structure of the memory may be prepared by any one of the methods for preparing a substrate structure of a memory described above.

Another aspect of the present invention is directed to a memory. The memory may include any one of the substrate structures described above.

According to the memory, the substrate structure of the memory, and the method for preparing the substrate structure of the memory in the present invention, the second mask layer is formed by removing the sacrificial portions while retaining the second dielectric material filled in the gaps between the sacrificial portions. The sacrificial portions may cover a portion of the plurality of strip patterns, so that through-holes exposing the strip patterns are formed in the areas that correspond to the sacrificial portions in the formed second mask layer. The strip patterns and the through-hole patterns can be conveniently transferred to the substrate by using the first mask layer and the second mask layer as masks to etch the substrate, so that the plurality of active areas arranged in an array can be conveniently formed.

Other characteristics and advantages of the present invention will become apparent through the following detailed descriptions, or partly learned through the practice of the present invention.

The foregoing general descriptions and the following detailed descriptions are merely examples and explanations and do not intend to limit the present invention.

BRIEF DESCRIPTION OF THE DRAWINGS

The accompanying drawings illustrate embodiments in accordance with the present invention, and are used to explain the principle of the present invention. The accompanying drawings in the following descriptions show merely some embodiments of the present invention. A person of ordinary skill in the art may still derive other accompanying drawings from these accompanying drawings without creative efforts.

DETAIL DESCRIPTION OF THE EMBODIMENTS

The exemplary implementations are comprehensively described with reference to the accompanying drawings. However, the example implementations can be implemented in a plurality of forms, and it should not be understood that the example implementations are limited to the example implementations described herein. On the contrary, providing these implementations makes the present invention more comprehensive and complete, and the concepts of the example implementations are comprehensively conveyed to a person skilled in the art. The described features, structures, or characteristics may be combined in one or more implementations in any proper manner. In the following descriptions, many specific details are provided to provide a full understanding of the implementations of the present invention. However, a person skilled in the art should be aware that the technical solutions in the present invention may be implemented without one or more of the specific details, or by using other methods, steps, etc. In other cases, the well-known technical solutions are not shown or described in detail in order to avoid obscuring the aspects of the present invention due to distraction.

In addition, the accompanying drawings are merely schematic diagrams of the present invention and are not necessarily drawn to scale. Same reference signs in the figures represent same or similar parts, and therefore are not repeatedly described. Some of the block diagrams shown in the accompanying drawings are functional entities and do not necessarily correspond to physically or logically independent entities. These functional entities may be implemented in the form of software, or in one or more hardware modules or integrated circuits, or in different networks and/or processor apparatuses and/or microcontroller apparatuses.

The terms "one", "a", and "the" are used to indicate the existence of one or more elements/components/etc. The terms "include" and "have" are used to indicate open inclusion and the existence of an element/a component/etc. in addition to the listed element/component/etc. The terms such as "first" and "second" each are merely used as a sign and constitute no limitation on the number of its object.

Figure 1:
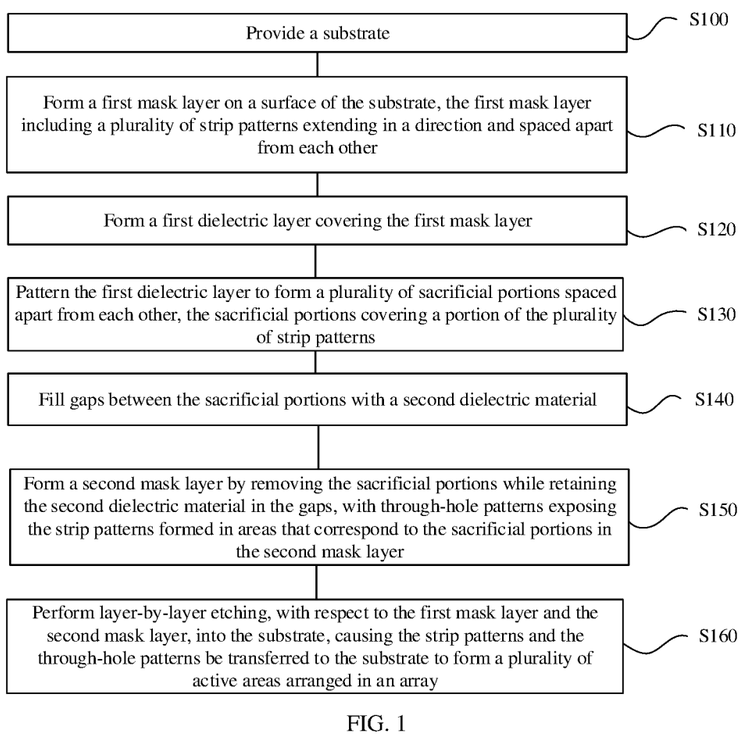
FIG. 1 is a schematic flowchart of a method for preparing a substrate structure of a memory according to an exemplary embodiment of the present invention.

This invention first provides a method for preparing a substrate structure of a memory. Referring to FIG. 1, the method for preparing a substrate structure of a memory may include steps S100 through S160.

In step S100, a substrate may be provided.

In step S110, a first mask layer may be formed on a surface of the substrate. The first mask layer may include a plurality of strip patterns extending in a direction and spaced apart from each other.

In step S120, a first dielectric layer covering the first mask layer may be formed.

In step S130, the first dielectric layer may be patterned to form a plurality of sacrificial portions spaced apart from each other. The sacrificial portions may cover a portion of the plurality of strip patterns.

In step S140, gaps between the sacrificial portions may be filled with a second dielectric material.

In step S150, a second mask layer may be formed by removing the sacrificial portions while retaining the second dielectric material in the gaps. Through-hole patterns exposing the strip patterns may be formed in areas that correspond to the sacrificial portions in the second mask layer.

In step S160, layer-by-layer etching, using the first mask layer and the second mask layer as masks, into the substrate may be performed. The etching may transfer the strip patterns and the through-hole patterns to the substrate to form a plurality of active areas arranged in an array.

According to the method for preparing a substrate structure of a memory in this example implementation, the second mask layer is formed by removing the sacrificial portions while retaining the second dielectric material filled in the gaps between the sacrificial portions. The sacrificial portions may cover a portion of the plurality of strip patterns, so that through-holes exposing the strip patterns may be formed in the areas that correspond to the sacrificial portions in the formed second mask layer. The strip patterns and the through-hole patterns may be conveniently transferred to the substrate by using the first mask layer and the second mask layer as masks to etch into the substrate, and the plurality of active areas may be arranged in an array.

The method for preparing a substrate structure of a memory in this exemplary implementation is described below in greater details.

In step S100, the substrate may be provided.

The substrate may be a monocrystalline silicon substrate, a monocrystalline germanium substrate, or a silicon on insulator (SOI) substrate. The type of substrate is not specifically limited in this exemplary implementation.

In step S110, the first mask layer may be formed on the surface of the substrate. The first mask layer may include the plurality of strip patterns extending in the direction and spaced apart from each other.

Figure 2:
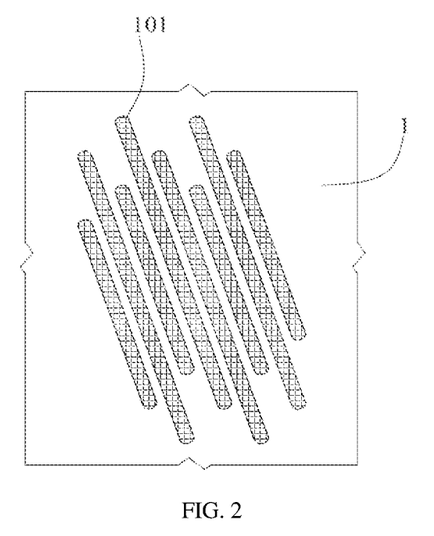
FIG. 2 is a schematic diagram showing a structure after step S110 of the method for preparing a substrate structure of a memory has been completed according to an exemplary embodiment of the present invention.

Referring to FIG. 2, the first mask layer may be made of materials including, but not limited to, silicon oxide. In one example, strip patterns 101 may be evenly spaced apart from each other. That is, any two adjacent strip patterns 101 may be spaced apart by the same distance. In another example, strip patterns 101 may not be evenly spaced apart from each other. This specification is not limited in this regard.

The strip patterns 101 may all be convex structures. In one example, forming the first mask layer on the surface of the substrate 1 may include: forming a first material layer on the surface of the substrate 1; and patterning the first material layer to form the first mask layer. The first material layer may be formed by chemical vapor deposition or atomic layer deposition. Other suitable methods may be used, and this specification is not limited in this regard. The patterning process may be a self-aligned dual patterning (SADP) process or a self-aligned quadruple patterning (SAQP) process. Other suitable processes may be used, and this specification is not limited in this regard.

In step S120, the first dielectric layer covering the first mask layer may be formed.

The first dielectric layer may be prepared through chemical vapor deposition or atomic layer deposition. Other suitable methods may be used, and this specification is not limited in this regard. In one example, the first dielectric layer may be made of one or more of silicon nitride, silicon oxynitride (SiON), and silicon carbon nitride (SiCN). In another example, the first dielectric layer may be made of silicon oxide. The first dielectric layer may be made of other suitable materials, and this specification is not limited in this regard.

The thickness of the first dielectric layer may be determined according to a specific requirement and is not limited in this invention.

In step S130, the first dielectric layer may be patterned to form the plurality of sacrificial portions spaced apart from each other. The sacrificial portions may cover a portion of the plurality of strip patterns.

The first dielectric layer may be patterned by using a photolithography-etching-photolithography-etching process. More specifically, referring to FIG. 3, patterning the first dielectric layer to form a plurality of sacrificial portions spaced apart from each other may include step S1301 and step S1302.

Figure 3:
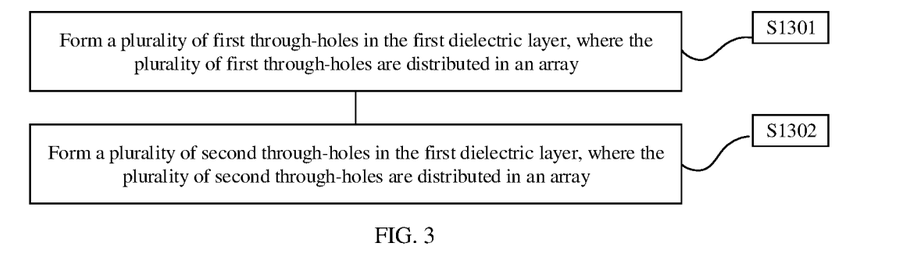
FIG. 3 is a schematic flowchart of step S130 of the method for preparing a substrate structure of a memory according to an exemplary embodiment of the present invention.

In step S1301, a plurality of first through-holes may be formed in the first dielectric layer. The plurality of first through-holes may be distributed in an array.

The plurality of first through-holes may be formed in the first dielectric layer by using a photolithography process. More specifically, the photolithography process may include: forming a photoresist layer on the first dielectric layer; exposing and developing the photoresist layer to form a plurality of channels; and etching the first dielectric layer by using the photoresist layer, in which the plurality of channels are formed, as a mask to form the first through-holes in areas that correspond to the channels in the first dielectric layer.

Figure 4:
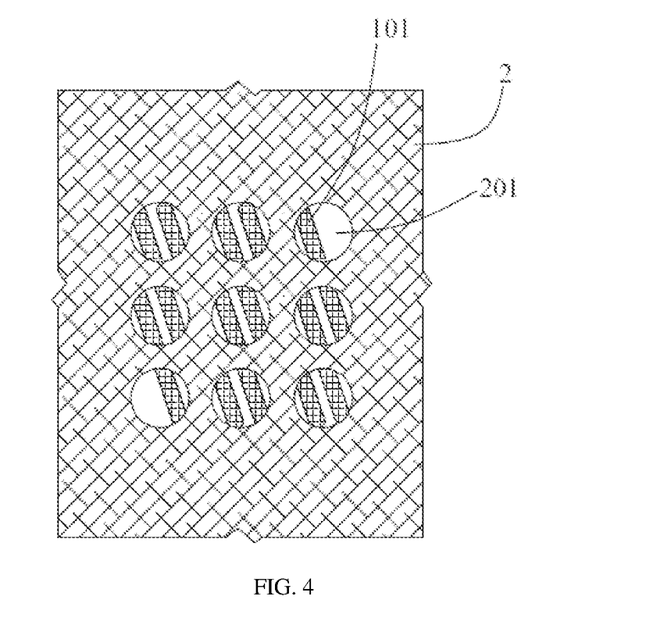
FIG. 4 is a schematic diagram showing a structure after step S1301 of the method for preparing a substrate structure of a memory has been completed according to an exemplary embodiment of the present invention.

Referring to FIG. 4, in some embodiments, the first through-holes 201 may be circular holes or oval holes. In some embodiments, the first through-holes 201 may be square holes, and this specification is not limited in this regard.

In step S1302, a plurality of second through-holes may be formed in the first dielectric layer. The plurality of second through-holes may be distributed in an array.

Figure 5:
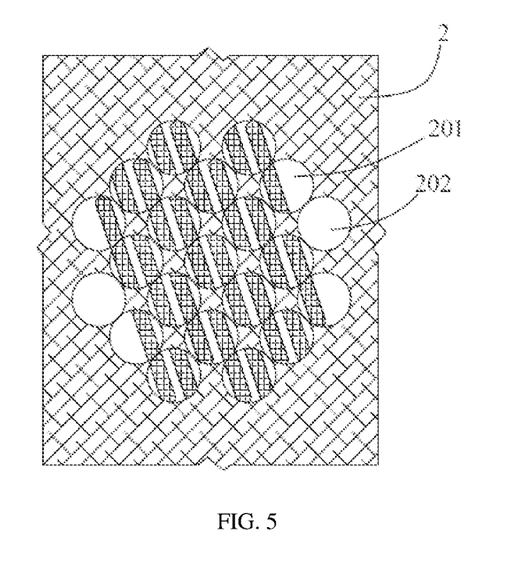
FIG. 5 is a schematic diagram showing a structure after step S1302 of the method for preparing a substrate structure of a memory has been completed according to an exemplary embodiment of the present invention.

Referring to FIG. 5, in some embodiments, the second through-holes 202 may be circular holes or oval holes. In some embodiments, the second through-holes 202 may be square holes, and this specification is not limited in this regard.

In some embodiments, the second through-holes 202 and the first through-holes 201 may have the same cross-sectional shape. For example, the second through-holes 202 and the first through-holes 201 may both be circular holes. The first through-holes 201 and the second through-holes 202 may have the same size or different sizes, and this specification is not limited in this regard.

Figure 6:
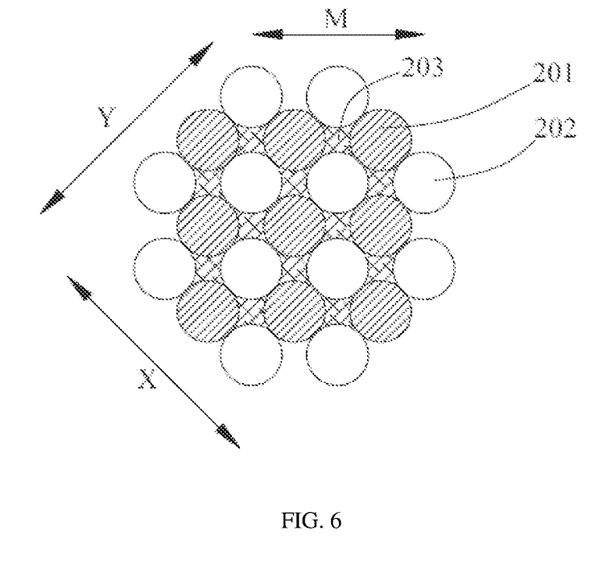
FIG. 6 is a schematic diagram of first through-holes, second through-holes, and sacrificial portions in the method for preparing a substrate structure of a memory according to an exemplary embodiment of the present invention.

Referring to FIGS. 5 and 6, the first through-holes 201 and the second through-holes 202 may be alternately arranged in a first direction. That is, any first through-hole 201 may be adjacent to one second through-hole 202 in the first direction. The first direction may be the X direction as shown in FIG. 6.

The first direction may be parallel to the substrate 1. Further, an orthographic projection of any first through-hole 201 on the substrate 1 may be in contact or overlap with an orthographic projection of a neighboring second through-hole 202 on the substrate 1 in the first direction.

In some embodiments, the first through-holes 201 and the second through-holes 202 may be circular holes. In the first direction, an orthographic projection of any first through-hole 201 on the substrate 1 may be in contact or overlap with an orthographic projection of a neighboring second through-hole 202 on the substrate 1. That is, a distance between an axis of any first through-hole 201 and an axis of a neighboring second through-hole 202 may be less than or equal to a sum of a radius of the first through-hole 201 and a radius of the second through-hole 202. In some embodiments, the first direction may be different from an extension direction of the strip pattern 101.

Referring to FIGS. 5 and 6, the first through-holes 201 and the second through-holes 202 may be alternately arranged in a second direction. That is, any first through-hole 201 may be adjacent to one second through-hole 202 in the second direction. The second direction may be the Y direction as shown in FIG. 6.

The second direction may be parallel to the substrate 1 and perpendicular to the first direction. Further, an orthographic projection of any first through-hole 201 on the substrate 1 may be in contact or overlap with an orthographic projection of a neighboring second through-hole 202 on the substrate 1 in the second direction.

In some embodiments, in the second direction, the first through-holes 201 and the second through-holes 202 may be circular holes. An orthographic projection of any first through-hole 201 on the substrate 1 may be in contact or overlap with an orthographic projection of a neighboring second through-hole 202 on the substrate 1. That is, a distance between an axis of any first through-hole 201 and an axis of a neighboring second through-hole 202 may be less than or equal to a sum of a radius of the first through-hole 201 and a radius of the second through-hole 202. In some embodiments, the second direction may be different from the extension direction of the strip pattern 101.

Referring to FIGS. 5 and 6, a portion of the first dielectric layer 2 between any first through-hole 201 and a neighboring first through-hole 201 in a third direction may form the sacrificial portion 203. The third direction may be the M direction as shown in FIG. 6. The third direction may be parallel to the substrate 1, and a deviation angle of the third direction relative to the first direction may be π/4 (i.e., 45°). That is, an angle between the third direction and the first direction may be π/4.

In some embodiments, the first through-holes 201 and the second through-holes 202 may be circular holes. Diameters of the first through-holes 201 and the second through-holes 202 may each be greater than the maximum size of the sacrificial portion 203 in a direction parallel to the substrate 1. In some embodiments, the third direction may be different from the extension direction of the strip pattern 101.

In step S140, the gaps between the sacrificial portions may be filled with the second dielectric material.

Figure 7:
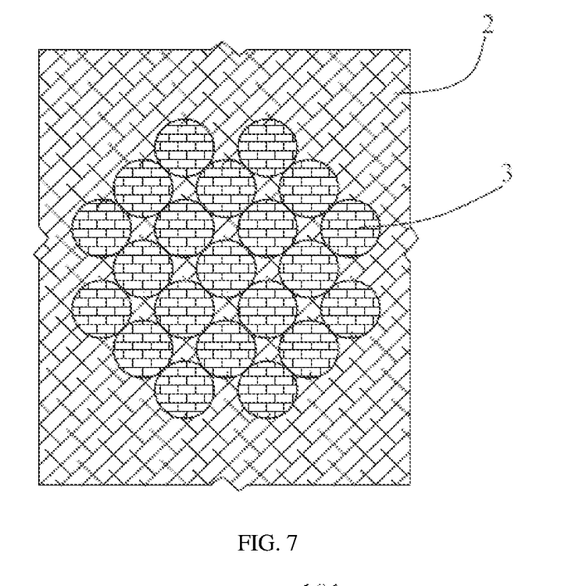
FIG. 7 is a schematic diagram showing a structure after step S140 of the method for preparing a substrate structure of a memory has been completed according to an exemplary embodiment of the present invention.

Referring to FIGS. 6 and 7, an etching rate of the second dielectric material 3 may be less than an etching rate of the sacrificial portion 203. The second dielectric material 3 may be, but not limited to, silicon oxide, BPSG (borophosphosilicate glass), BSG (borosilicate glass) or PSG (phosphosilicate glass). In some embodiments, the second dielectric material 3 may be silicon nitride.

In some embodiments, filling gaps between the sacrificial portions 203 with a second dielectric material 3 may include: forming a second dielectric layer covering the sacrificial portions 203 and the gaps between the sacrificial portions 203; and removing portions of the second dielectric layer outside the gaps. The second dielectric layer may be formed through chemical vapor deposition or atomic layer deposition. The second dielectric layer may be formed by other suitable methods, and this specification is not limited in this regard.

The portions of the second dielectric layer outside the gaps may be removed through grinding. The grinding may be chemical mechanical grinding. In some embodiments, a portion of the first dielectric layer 2 between any first through-hole 201 and a neighboring first through-hole 201 may form the sacrificial portion 203. The second dielectric material 3 may be filled in the first through-holes 201 and the second through-holes 202.

In step S150, the second mask layer may be formed by removing the sacrificial portions while retaining the second dielectric material in the gaps. The through-hole patterns exposing the strip patterns may be formed in the areas that correspond to the sacrificial portions in the second mask layer.

Figure 8:
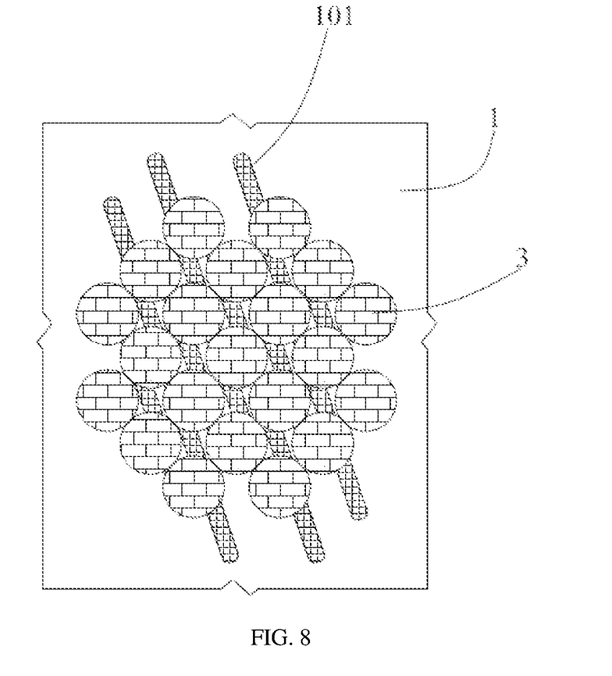
FIG. 8 is a schematic diagram showing a structure after step S150 of the method for preparing a substrate structure of a memory has been completed according to an exemplary embodiment of the present invention.

Referring to FIG. 8, the second mask layer may be formed by etching the sacrificial portions 203. In some embodiments, the second mask layer may be formed by etching the sacrificial portion 203 and the second dielectric material 3. The etching may be performed by using a dry etching process or a wet etching process, and this specification is not limited in this regard.

In some embodiments, the second dielectric material 3 may be silicon oxide, and the sacrificial portion 203 may be made of silicon nitride. The sacrificial portions 203 and the second dielectric material 3 may be etched by using phosphoric acid to form the second mask layer.

The through-hole patterns exposing the strip patterns 101 may be formed in the areas that correspond to the sacrificial portions 203 in the second mask layer. In some embodiments, the second dielectric material 3 may be silicon nitride, and the sacrificial portion 203 may be made of silicon oxide. The sacrificial portions 203 and the second dielectric material 3 may be etched by using hydrofluoric acid to form the second mask layer. The through-hole patterns exposing the strip patterns 101 may be formed in the areas that correspond to the sacrificial portions 203 in the second mask layer.

In some embodiments, the size of the through-hole pattern in a direction perpendicular to the extension direction of the strip pattern 101 may be greater than the width of the strip pattern 101. That is, the projection of the through-hole pattern on the substrate 1 may cover a projection of the strip pattern 101 on the substrate 1.

In step S160, layer-by-layer etching into the substrate may be performed using the first mask layer and the second mask layer as masks. The etching may transfer the strip patterns and the through-hole patterns to the substrate to form the plurality of active areas arranged in an array.

In some embodiments, performing layer-by-layer etching into the substrate using the first mask layer and the second mask layer as masks may include: etching, using the second mask layer as a mask, the first mask layer, to transfer the through-hole patterns to the first mask layer to sever the strip patterns; and etching, using the first mask layer with severed strip patterns as a mask, the substrate, to transfer the strip patterns and the through-hole patterns to the substrate to form the plurality of active areas arranged in an array.

Figure 9:
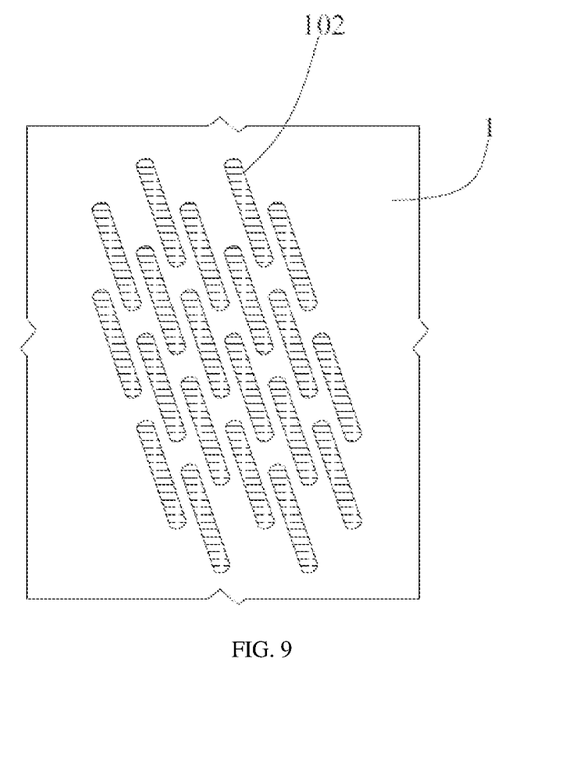
FIG. 9 is a schematic diagram showing a structure after step S160 of the method for preparing a substrate structure of a memory has been completed according to an exemplary embodiment of the present invention.

The etching may be performed by using a dry etching process or a wet etching process, and this specification is not limited in this regard. In some embodiments, referring to FIG. 9, the plurality of active areas 102 may be spaced apart from each other.

In the method for preparing a substrate structure of a memory disclosed herein, a first mask layer comprising a plurality of strip patterns extending in a direction and spaced apart from each other is first formed on a surface of the substrate. Then, a first dielectric layer covering the first mask layer is formed, and a plurality of sacrificial portions spaced apart from each other and covering a portion of the plurality of strip patterns is formed in the first dielectric layer. The gaps between the sacrificial portions may be filled with a second dielectric material, and a second mask layer may be formed by removing the sacrificial portions while retaining the second dielectric material in the gaps. The second mask layer may include through-hole patterns exposing the strip patterns formed in areas that correspond to the sacrificial portions. Then, a plurality of active areas may be formed by etching, using the first and the second mask layers as masks, to transfer the strip patterns and the through-hole patterns to the substrate. This method facilitates the forming of the plurality of active areas on the substrate.

This invention further provides a substrate structure of a memory. The substrate structure of the memory may be prepared by using the method for preparing a substrate structure of a memory according to any one of the foregoing method embodiments. Therefore, the substrate structure of the memory may have the same beneficial effects as the method for preparing a substrate structure of a memory according to any one of the foregoing method embodiments. Relevant parts in the foregoing description may be referred to for details, which are not repeatedly described herein for the sake of conciseness.

This invention further provides a memory. The memory may include the substrate structure of the memory according to the foregoing embodiments. The memory may further include other structures such as a capacitor structure, and this specification is not limited in this regard.

In some embodiments, the substrate structure included in the memory may be the same as the substrate structure in the foregoing embodiments of the substrate structure of the memory. Therefore, the substrate structure included in the memory may have the same beneficial effects as the substrate structure in the foregoing embodiments of the substrate structure of the memory. Relevant parts in the foregoing description may be referred to for details, which are not repeatedly described herein for the sake of conciseness.

Although the steps of the method in the present invention are described in a specific order in the accompanying drawings, this does not require or imply that these steps must be performed in the specific order, or that all the shown steps must be performed to achieve the desired results. Additionally, or alternatively, some steps may be omitted, a plurality of steps may be combined into one step for execution, and/or one step is divided into a plurality of steps for execution, etc.

A person skilled in the art can easily figure out other embodiments of the present invention after considering the specification and practicing the invention that is disclosed herein. This application is intended to cover any variations, functions, or adaptive changes of the present invention. These variations, functions, or adaptive changes comply with general principles of the present invention and include common knowledge or a commonly used technical means that is in the technical field and that is not disclosed in the present specification. The specification and the embodiments are merely considered as examples, and the actual scope and spirit of the present invention are specified by the claims.

The present invention is not limited to the accurate structures that are described above and that are shown in the accompanying drawings, and various modifications and changes may be made without departing from the scope of the present invention. The scope of the present invention is limited only by the appended claims.

What is claimed is:

1. A method for preparing a substrate structure of a memory, comprising:
    providing a substrate;
    forming a first mask layer on a surface of the substrate, the first mask layer comprising a plurality of strip patterns extending in a direction and spaced apart from each other;
    forming a first dielectric layer on and covering the plurality of strip patterns of the first mask layer;
    patterning the first dielectric layer to form a plurality of sacrificial portions spaced apart from each other, the sacrificial portions covering a first portion of the plurality of strip patterns and exposing a second portion of the plurality of strip patterns;
    filling gaps between the sacrificial portions with a second dielectric material;
    forming, by removing the sacrificial portions while retaining the second dielectric material in the gaps, a second mask layer, with through-hole patterns exposing the first portion of the plurality of strip patterns formed in areas that correspond to the sacrificial portions in the second mask layer; and
    performing layer-by-layer etching using the first mask layer and the second mask layer as masks to transfer the strip patterns and the through-hole patterns to the substrate to form a plurality of active areas arranged in an array.

2. The method of claim 1, wherein patterning the first dielectric layer to form the plurality of sacrificial portions spaced apart from each other comprises:
    forming a plurality of first through-holes distributed in an array in the first dielectric layer; and
    forming a plurality of second through-holes distributed in an array in the first dielectric layer, the first through-holes and the second through-holes are alternately arranged in both a first direction and a second direction perpendicular to the first direction, and an orthographic projection of any first through-hole on the substrate is in contact or overlaps with an orthographic projection of a neighboring second through-hole on the substrate in the first direction and the second direction,
    wherein a portion of the first dielectric layer between any two neighboring first through-holes in a third direction forms a sacrificial portion, and a deviation angle of the third direction relative to the first direction is $\pi/4$.

3. The method of claim 2, wherein the first through-holes and the second through-holes have a same cross-sectional shape.

4. The method of claim 3, wherein the first through-holes and the second through-holes are circular holes.

5. The method of claim 4, wherein the first through-holes and the second through-holes have a same diameter.

6. The method of claim 1, wherein removing the sacrificial portions while retaining the second dielectric material in the gaps comprises:
    etching the sacrificial portions to form the second mask layer, wherein the through-hole patterns exposing the first portion of the plurality of strip patterns are formed in the areas that correspond to the sacrificial portions in the second mask layer.

7. The method of claim 6, wherein an etching rate of the second dielectric material is less than an etching rate of the sacrificial portion, and etching the sacrificial portions to form the second mask layer comprises:
    etching the sacrificial portions and the second dielectric material to form the second mask layer, wherein the through-hole patterns exposing the first portion of the plurality of strip patterns are formed in the areas that correspond to the sacrificial portions in the second mask layer.

8. The method of claim 7, wherein the second dielectric material is silicon oxide, and the sacrificial portion is made of silicon nitride.

9. The method of claim 8, wherein etching the sacrificial portions and the second dielectric material to form the second mask layer comprises:
    etching, by using phosphoric acid, the sacrificial portions and the second dielectric material to form the second mask layer, wherein the through-hole patterns exposing the first portion of the plurality of strip patterns are formed in the areas that correspond to the sacrificial portions in the second mask layer.

10. The method of claim 7, wherein the second dielectric material is silicon nitride, and the sacrificial portion is made of silicon oxide.

11. The method of claim 10, wherein etching the sacrificial portions and the second dielectric material to form the second mask layer comprises:
    etching, by using hydrofluoric acid, the sacrificial portions and the second dielectric material to form the second mask layer, wherein the through-hole patterns exposing the first portion of the plurality of strip patterns are formed in the areas that correspond to the sacrificial portions in the second mask layer.

12. The method of claim 1, wherein performing layer-by-layer etching, using the first mask layer and the second mask layer as masks to transfer the strip patterns and the through-hole patterns to the substrate to form a plurality of active areas arranged in an array comprises:
    etching, using the second mask layer as a mask, the first mask layer, to transfer the through-hole patterns to the first mask layer to sever the strip patterns; and
    etching, using the first mask layer with severed strip patterns as a mask, the substrate, to transfer the strip patterns and the through-hole patterns to the substrate to form the plurality of active areas arranged in the array.

13. The method of claim 1, wherein a distance between any two adjacent sacrificial portions is greater than a maximum size of any sacrificial portion in a direction parallel to the substrate.

14. The method of claim 1, wherein filling the gaps between the sacrificial portions with the second dielectric material comprises:
    forming a second dielectric layer covering the sacrificial portions and the gaps between the sacrificial portions; and
    removing portions of the second dielectric layer outside the gaps.

15. The method of claim 14, wherein removing the portions of the second dielectric layer outside the gaps comprises:
    removing, by using a chemical mechanical grinding process, the portions of the second dielectric layer outside the gaps.

16. A substrate structure of a memory, wherein the substrate structure is prepared by a method, the method comprising:
    providing a substrate;
    forming a first mask layer on a surface of the substrate, the first mask layer comprising a plurality of strip patterns extending in a direction and spaced apart from each other;
    forming a first dielectric layer on and covering the plurality of strip patterns of the first mask layer;
    patterning the first dielectric layer to form a plurality of sacrificial portions spaced apart from each other, the sacrificial portions covering a first portion of the plurality of strip patterns and exposing a second portion of the plurality of strip patterns;
    filling gaps between the sacrificial portions with a second dielectric material;
    forming, by removing the sacrificial portions while retaining the second dielectric material in the gaps, a second mask layer, with through-hole patterns exposing the first portion of the plurality of strip patterns formed in areas that correspond to the sacrificial portions in the second mask layer; and
    performing layer-by-layer etching using the first mask layer and the second mask layer as masks to transfer the strip patterns and the through-hole patterns to the substrate to form a plurality of active areas arranged in an array.

17. A memory, comprising the substrate structure of claim 16.

* * * * *